(12) United States Patent
Seebacher et al.

(10) Patent No.: US 11,430,744 B2
(45) Date of Patent: Aug. 30, 2022

(54) DIE-ATTACH METHOD TO COMPENSATE FOR THERMAL EXPANSION

(71) Applicant: Cree, Inc., Durham, NC (US)

(72) Inventors: David Seebacher, Villach (AT); Christian Schuberth, Villach-Landskron (AT); Peter Singerl, Villach (AT); Alexander Komposch, Morgan Hill, CA (US)

(73) Assignee: Cree, Inc., Durham, NC (US)

( * ) Notice: Subject to any disclaimer, the term of this patent is extended or adjusted under 35 U.S.C. 154(b) by 387 days.

(21) Appl. No.: 15/673,734

(22) Filed: Aug. 10, 2017

(65) Prior Publication Data
US 2019/0051617 A1 Feb. 14, 2019

(51) Int. Cl.
| | |
|---|---|
| H01L 21/48 | (2006.01) |
| H01L 23/373 | (2006.01) |
| H01L 23/00 | (2006.01) |
| H01L 23/42 | (2006.01) |
| H01L 23/367 | (2006.01) |

(52) U.S. Cl.
CPC ........ *H01L 23/562* (2013.01); *H01L 21/4878* (2013.01); *H01L 21/4882* (2013.01); *H01L 24/75* (2013.01); *H01L 24/83* (2013.01); *H01L 23/367* (2013.01); *H01L 23/3736* (2013.01); *H01L 23/42* (2013.01); *H01L 24/32* (2013.01); *H01L 2224/291* (2013.01); *H01L 2224/2919* (2013.01); *H01L 2224/32013* (2013.01); *H01L 2224/32225* (2013.01); *H01L 2224/32245* (2013.01); *H01L 2224/75703* (2013.01); *H01L 2224/83048* (2013.01); *H01L 2224/8382* (2013.01); *H01L 2224/8384* (2013.01); *H01L 2224/83097* (2013.01); *H01L 2224/83191* (2013.01); *H01L 2224/83193* (2013.01); *H01L 2224/83424* (2013.01); *H01L 2224/83444* (2013.01); *H01L 2224/83447* (2013.01); *H01L 2924/1033* (2013.01); *H01L 2924/10253* (2013.01); *H01L 2924/10254* (2013.01); *H01L 2924/10272* (2013.01); *H01L 2924/15724* (2013.01); *H01L 2924/15747* (2013.01); *H01L 2924/351* (2013.01); *H01L 2924/3512* (2013.01)

(58) Field of Classification Search
None
See application file for complete search history.

(56) References Cited

U.S. PATENT DOCUMENTS

| | | | |
|---|---|---|---|
| 2008/0079166 A1* | 4/2008 | Lee | H01L 23/3192 257/762 |
| 2010/0193943 A1* | 8/2010 | Crowder | H01L 23/047 257/737 |

(Continued)

*Primary Examiner* — Xiaoming Liu
(74) *Attorney, Agent, or Firm* — Shumaker & Sieffert, P.A.

(57) ABSTRACT

In sonic examples, a method includes pre-stressing a flange, heating the flange to a die-attach temperature, and attaching a die to the flange at the die-attach temperature using a die-attach material. In some examples, the flange includes a metal material, the die-attach temperature may be at least two hundred degrees Celsius, and the die-attach material may include solder and/or an adhesive. In some examples, the method includes cooling the semiconductor die and metal flange to a room temperature after attaching the semiconductor die to the metal flange at the die-attach temperature using a die-attach material.

20 Claims, 6 Drawing Sheets

(56) References Cited

U.S. PATENT DOCUMENTS

| | | | |
|---|---|---|---|
| 2011/0174443 A1* | 7/2011 | Sri-Jayantha | A47J 37/1219 156/494 |
| 2016/0161550 A1* | 6/2016 | Yeric | H01L 22/30 324/750.01 |
| 2017/0018542 A1* | 1/2017 | Seddon | H01L 25/50 |

* cited by examiner

DIE-ATTACH METHOD TO COMPENSATE FOR THERMAL EXPANSION

TECHNICAL FIELD

This disclosure relates to fabrication and manufacture of devices such as electronic devices.

BACKGROUND

A device may include a die, such as a semiconductor die, attached to a flange (e.g., a heat-sink element of a circuit package). The die may be attached to the flange using die-attach material such as solder or an adhesive that requires a higher temperature to form a bond. The die and the flange may have different coefficients of thermal expansion. As a result, when the die and flange are heated to the higher temperature, the die and flange may each expand in different amounts, causing mechanical stress in the device.

SUMMARY

This disclosure describes techniques for pre-stressing a flange to compensate for thermal expansion of the flange. At the higher temperature, the die may be attached to the flange using die-attach material to form a device. By pre-stressing the flange, the device may experience lower stresses when the device is cooled to a lower temperature.

In some examples, a method includes pre-stressing a flange, heating the flange to a die-attach temperature, and attaching a die to the flange at the die-attach temperature using a die-attach material.

In some examples, a device comprising a die, die-attach material, and a flange, wherein the device is prepared by a process comprising the steps of pre-stressing a flange, heating the flange to a die-attach temperature, and attaching a die to the flange at the die-attach temperature using a die-attach material.

In some examples, a method includes pre-stressing a metal flange, heating the metal flange to a die-attach temperature of at least two hundred degrees Celsius, attaching a semiconductor die to the metal flange at the die-attach temperature using solder or an adhesive, and cooling the semiconductor die and metal flange to a room temperature after attaching the semiconductor die to the metal flange at the die-attach temperature using a die-attach material.

The details of one or more examples are set forth in the accompanying drawings and the description below. Other features, objects, and advantages will be apparent from the description and drawings, and from the claims.

DETAILED DESCRIPTION

Figure 1A:
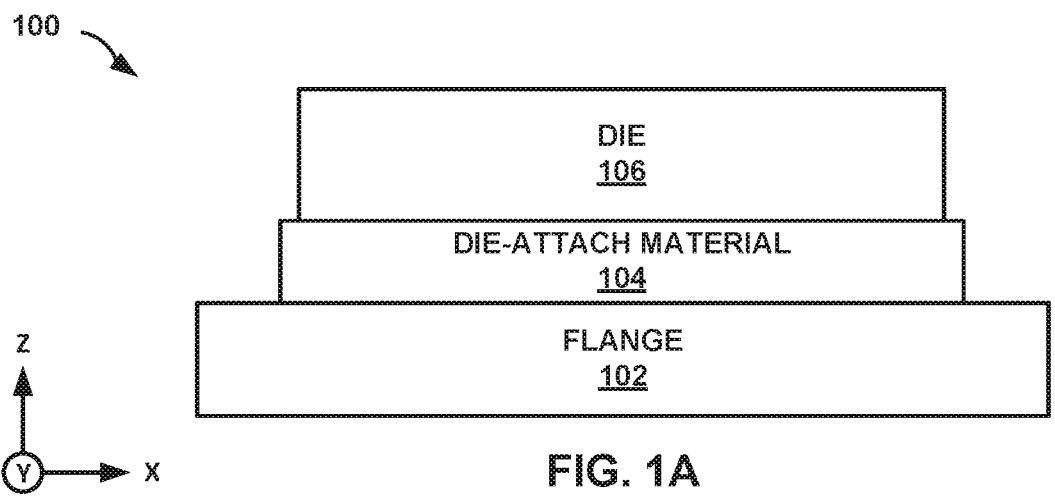
FIGS. 1A-1C are conceptual block diagrams of a device including a die and a flange, in accordance with some examples of this disclosure.

This disclosure is directed to a device and a process for manufacturing the device by attaching a die to a flange using a die-attach material. The process may include pre-stressing the flange to compensate for thermal expansion and thereby reduce stresses that may exist in the device at ambient temperatures after the attachment. The attachment of the die to the flange may occur at a die-attach temperature, and the device may be cooled after the attachment. During the cooling process, the device may experience stresses due the differing thermal contraction of the flange and the die. By pre-stressing the flange, the device may experience lower stress at the final ambient temperatures due to the thermal contraction of the flange and the die. The stresses caused by pre-stressing the flange may essentially counter balance the stresses caused by thermal expansion of the device during the cooling process. In this way, the stress at ambient temperatures can be reduced or eliminated in the device.

This disclosure describes the attachment of a die to a flange for high power devices, electronic devices, semiconductor devices, and other suitable devices. Generally, the die material and the flange material have different coefficients of thermal expansion (CTE's), which leads to mechanical stress and potential failure of the die-attach material at certain temperatures(i.e., reliability problems). This disclosure describes methods that may improve the stress behavior versus temperature by 'pre-stressing' the interface during the die-attach process. This method could be particularly valuable for processes which suffer from high CTE mismatches, such as silicon carbide dies or silicon dies mounted on copper flanges, which may be relatively cheap. Many other materials are possible for the die, including gallium nitride, sapphire, and/or diamond. High CTE mismatches may result in reliability issues for a manufactured device. The methods may enable the use of cheaper pure copper flanges instead of relatively expensive copper molybdenum flanges (CPC) in some devices.

In some examples, optimizing the die-attach properties, such as the thickness and/or the materials of the die-attach, may reduce the negative effects of CTE mismatch between a die and a flange. Adjusting the thickness and/or materials of the die-attach may provide a reliable attachment over a range of temperatures and throughout the lifetime of the device. This disclosure describes methods that may reduce the mechanical stress versus the operating temperature range by adding a 'stress offset' by means of mechanically stressing a flange during the die-attach process. These methods can be an enabling factor to avoid cracking of the die-attach interface at low temperatures and allow the use of cheaper materials. These methods may also increase the 'margin before failure' and thus improve reliability of established die attach processes.

A method may include applying mechanical stress or strain to either the die or the flange during the die-attach process at high temperatures. This mechanical stress may introduce an stress offset and thus may compensate for and therefore reduce the stress at lower temperatures, which may be critical for die-attach cracking. The stress or strain on the device can be introduced by stretching or constraining the die or the flange by means of a mechanical fixture. This could be done by increasing the force on existing clamping fixtures or by any other mechanical means. A flange may include part of a circuit package, such as a conductive pad, an exposed slug, and/or a heat-sink element.

Figure 1B:
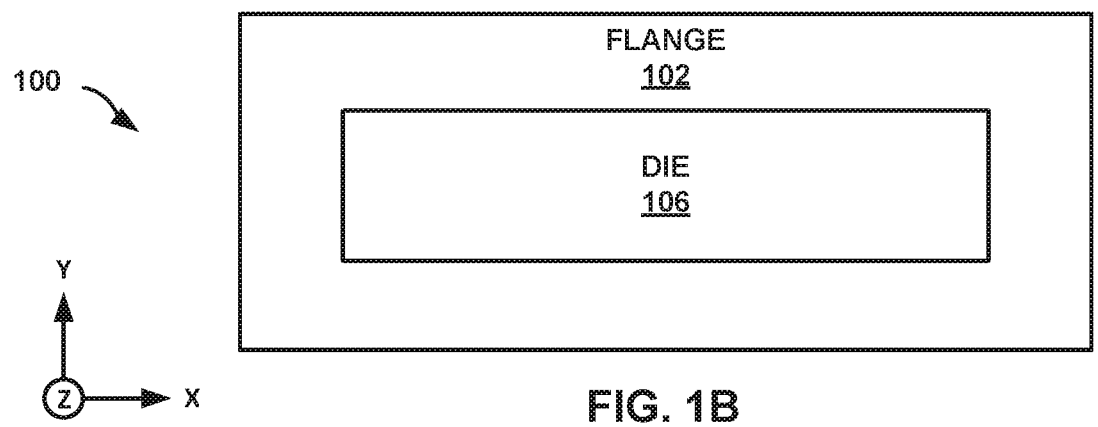
Figure 1C:
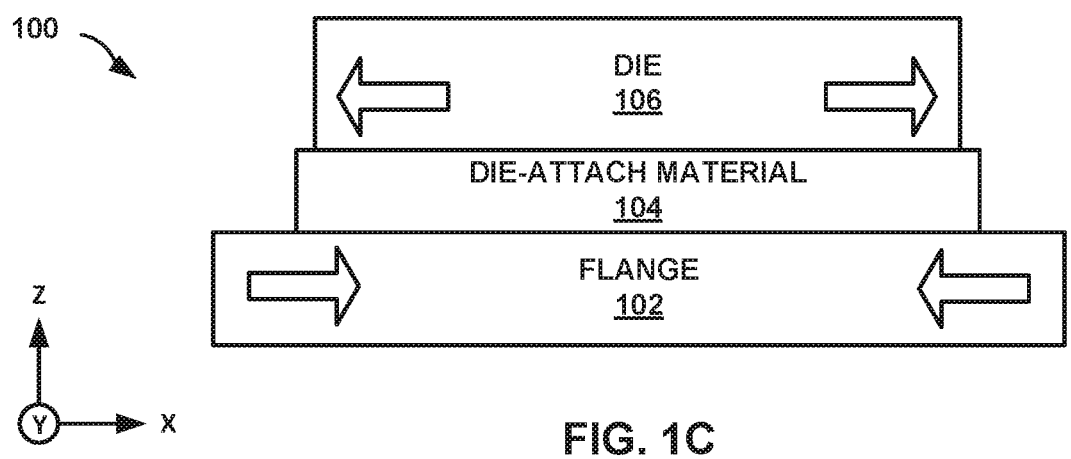

FIGS. 1A-1C are conceptual block diagrams of a device 100 including a die 106 and a flange 102, in accordance with some examples of this disclosure. FIG. 1A may depict a side view of device 100, and FIG. 1B may depict a top view of device 100. Device 100 may be a part of an electronics device, a semiconductor device, and/or any other suitable device that includes components with differing CTE's. Device 100 may include additional components not shown in FIGS. 1A-1C, such as a case or housing, additional electrically conductive or thermally conductive components, additional dies, and/or additional semiconductor components.

In some examples, flange 102 may be thermally conductive and/or electrically conductive material. In some examples, flange 102 may include or be part of a package or housing for device 100. If flange 102 includes metal, the CTE for flange 106 may be in the range of approximately twenty micrometers per meter per degree Celsius. Flange 102 may include a relatively soft metal such as copper, gold, or aluminum with a relatively good thermal conductivity.

Die-attach material 104 may include any attaching material and/or adhesive material such as solder, paste, tape, glue, epoxy, and/or metal sinter. Die-attach material 104 may be applied to the backside of die 106, and die 106 may be placed on flange 102 to bind or attach die 106 to flange 102. Die-attach material 104 may be configured to solidify when cooled from the die-attach temperature. In some examples, the connection between die 106 and flange 102 may include metalized plated laser vias, solder, and/or high-pressure/high-frequency metalized bonding such as diffusion bonding. Diffusion bonding may include direct bonding between die 106 and flange 102.

Die 106 may be a semiconductor die or any other die material. Die 106 may include transistors or any other electrical devices. The techniques of this disclosure may also be used with non-electrical devices that include a die and a flange with differing CTE's. For example, if die 106 includes silicon, the CTE for die 106 may be in the range of approximately one to five micrometers per meter per degree Celsius. In some examples, the CTE of flange 102 may be at least two times, at least three times, or at least five times as high as the CTE of die 106.

A manufacturing process may include assembling device 100 as shown in FIG. 1A at a relatively high temperature (e.g., a die-attach temperature), such as two hundred or three hundred degrees Celsius. The relative stress between flange 102, die-attach material 104, and die 106 in FIG. 1A may be zero. The manufacturing process may further include reducing the temperature of device 100 after device 100 is assembled. As shown in FIG. 1C, at a temperature that is lower than the die-attach temperature, flange 102 may apply a compressive stress, and die 106 may apply a tensile stress. As device 100 cools, flange 102 may contract more than die 106 contracts causing the tensile forces in die 106 and the compressive forces in flange 102.

Figure 2:
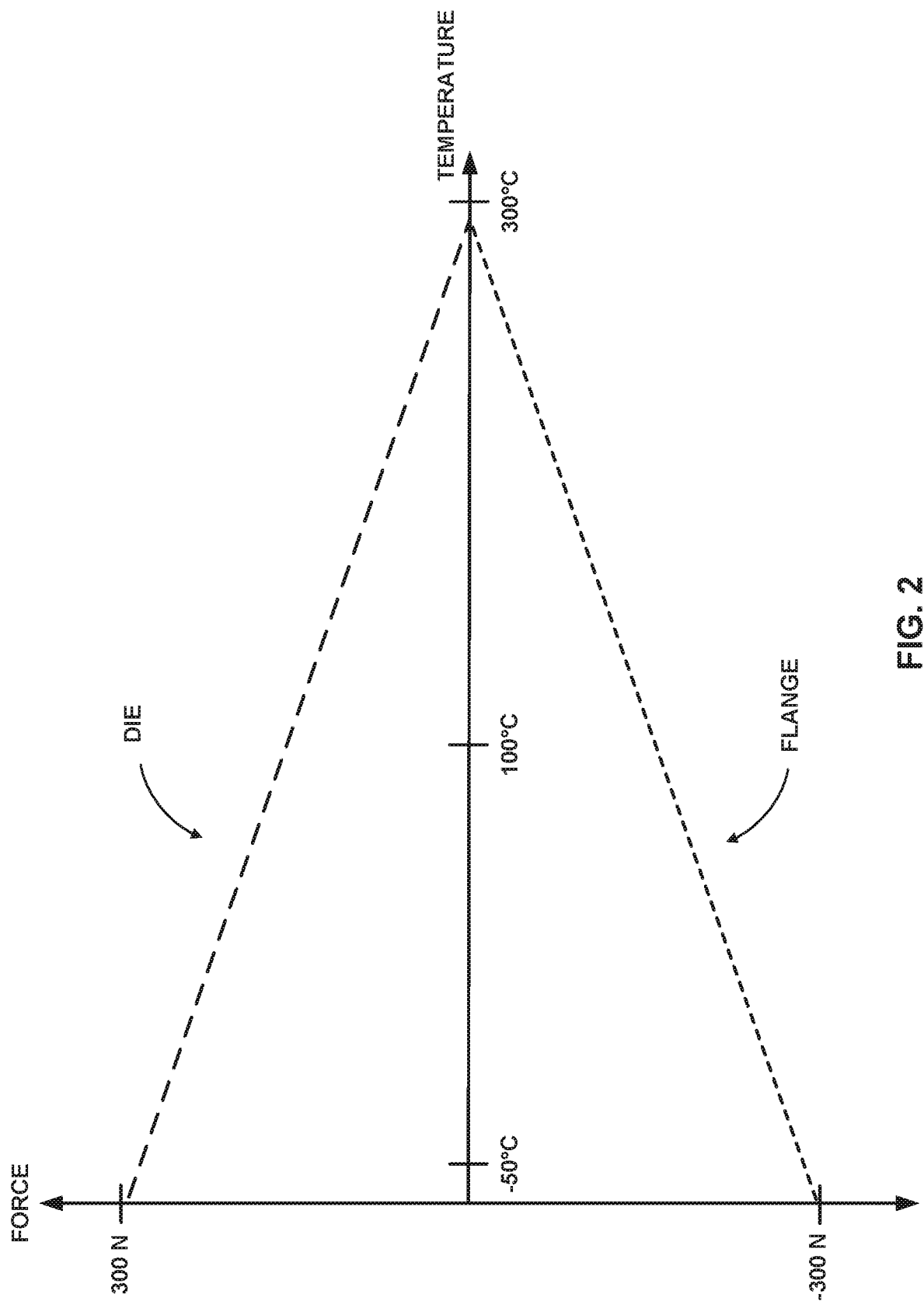
FIG. 2 depicts the stress conditions of a conventional die attach process versus temperature, illustrating the forces indicated in FIG 1C.

FIG. 2 depicts the stress conditions of a conventional die attach process versus temperature, illustrating the forces indicated in FIG. 1C. The graph in FIG. 2 may show the force or stress in each component after the die-attach step of the manufacturing process. Without pre-stressing, there may be no compressive forces or tensile forces present during the attachment of the die, when the die-attach material may solidify. However, the forces or stresses in the graph of FIG. 2 may highest at lower temperature (e.g., at room temperature).

At the die-attach step, no significant external mechanical force is applied to the die or the flange. During the die-attach process at high temperatures, which may be approximately three hundred degrees Celsius, the die-attach material may "freeze" at a "zero stress condition." In some examples, the die-attach temperature may be at least two hundred degrees Celsius, at least two hundred and fifty degrees Celsius, or at least three hundred degrees Celsius. In some examples, the die-attach temperature may be between two hundred and three hundred degrees Celsius or between two hundred and four hundred degrees Celsius. At this process step, the die and the flange will have different rates or amounts of expansion due to the high temperature. When lowering the temperature, the die and the flange will try to contract at different rates, which may lead to significant stress at the die-attach interface. At lower temperatures, such as negative forty degrees Celsius, the stress may be the highest and can exceed critical values, where the weakest point will fail (e.g., at a crack). This description uses general terminology, and the temperatures and force values serve as representations or examples. These examples are not necessarily linked to any specific process.

In some examples, the stress at or near three hundred degrees Celsius may be approximately zero for the flange and for the die. At the zero-stress temperature, the die may be attached to the flange. As the flange and the die are cooled from the zero-stress temperature (e.g., the die-attach temperature), the flange may contract more than the die contracts. At temperatures below the zero-stress temperature, the contraction of the flange may exert a negative, or compressive, force on the device, and the contraction of the die may exert a positive, or tensile, force on the device. The compressive force in flange 102 and the tensile force in die 106 are shown in FIG. 1C.

Figure 3A:
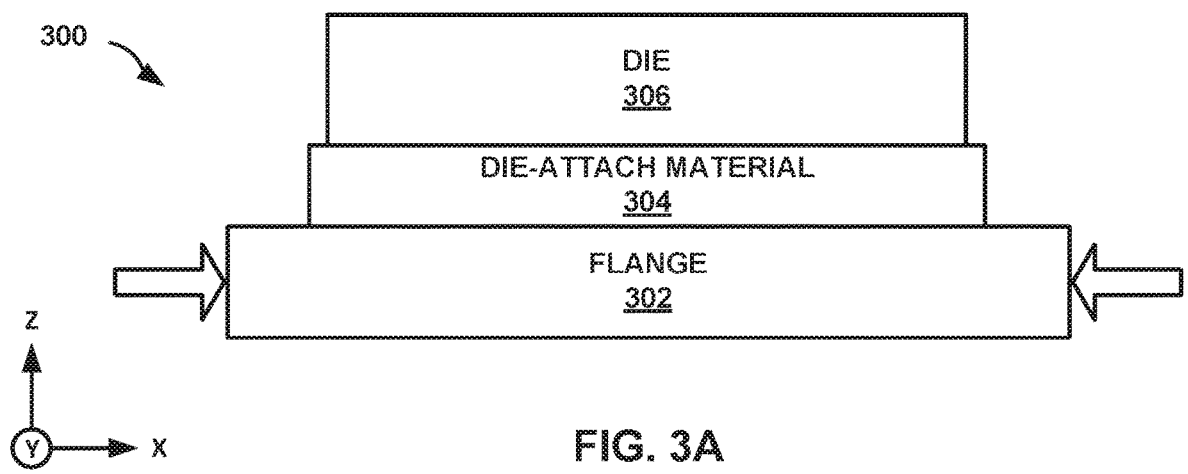
FIGS. 3A and 3B are conceptual block diagrams of pre-stressing a device, in accordance with some examples of this disclosure.
Figure 3B:
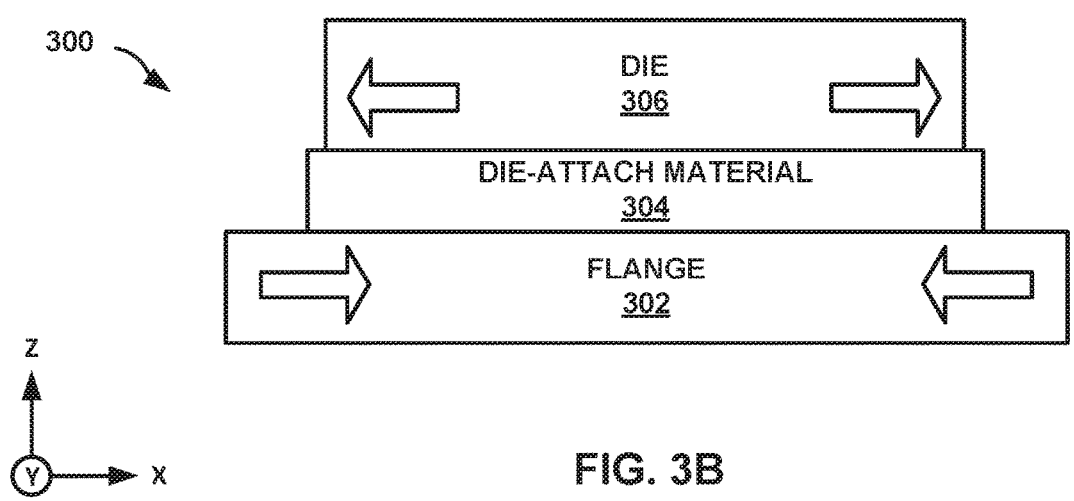

FIGS. 3A and 3B are conceptual block diagrams of pre-stressing a device, in accordance with some examples of this disclosure. To improve the stress behavior at lower temperatures, this disclosure describes mechanically "pre-stressing" either the die or the flange with an appropriate force, which may be a stress or a strain depending on CTE difference and application point. By applying mechanical stress to the flange during the die-attach process, as depicted in FIG. 3A, the flange will contract. The die-attach material will be in a "zero-stress" position when it "freezes." When removing the mechanical stress after the die-attach process, there may be an offset force at the die-attach interface due to the missing mechanical restriction. This can be seen in the stress/strain diagram versus temperature in FIG. 4, which illustrates the stress forces indicated in FIG. 3B. The stress/strain behavior now has an offset and a "zero-stress" condition lower than the die-attach temperature.

Figure 4:
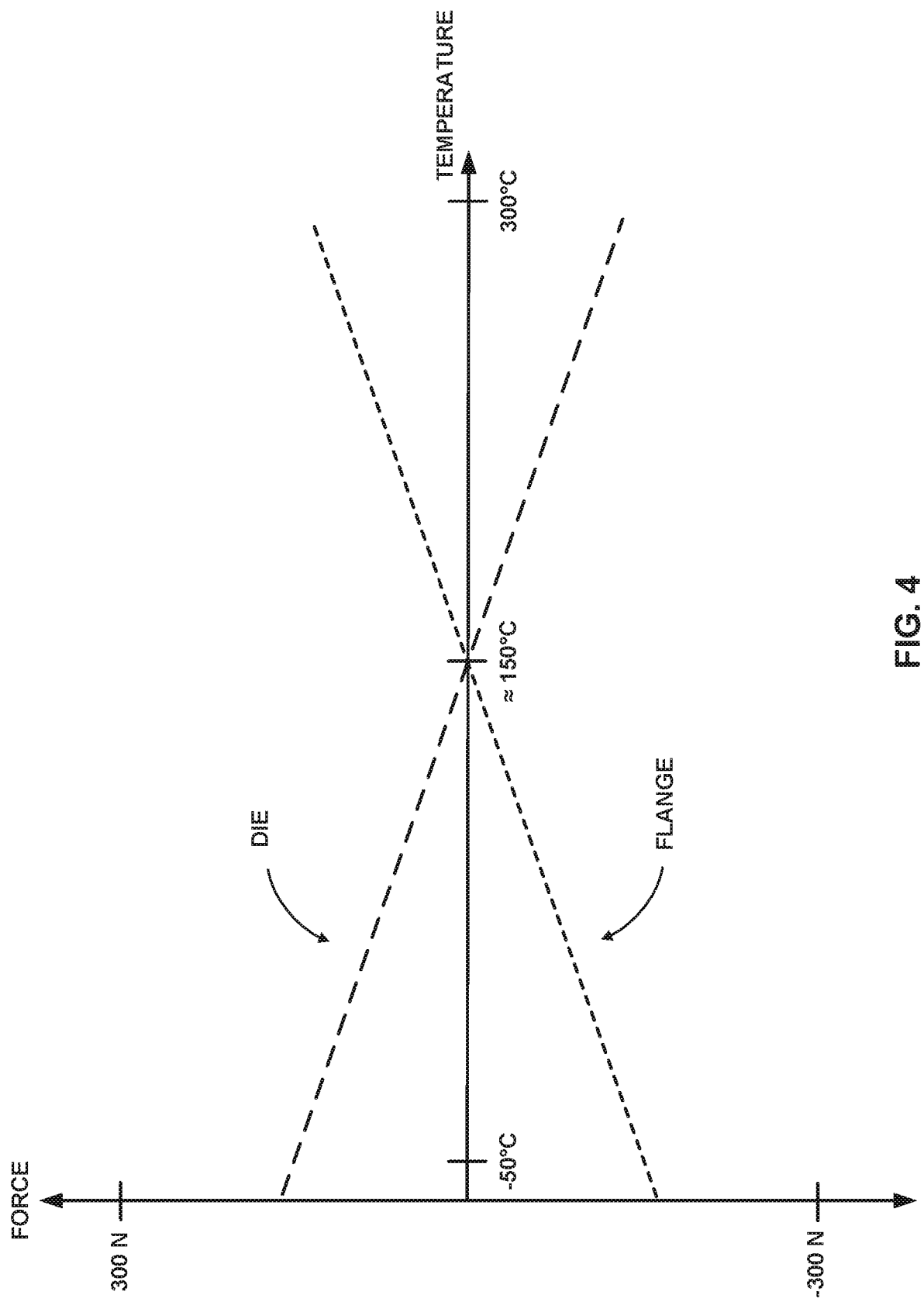
FIG. 4 shows a graph of force and temperature for a die-attach process that includes pre-stressing, in accordance with some examples of this disclosure.

This condition may lead to a reduced maximum stress at lower temperatures, which can be seen when comparing the peak stress values of FIG. 2 and FIG. 4. In some examples, flange 302 may be pre-stressed at a relatively low temperature, such as room temperature, before heating flange 302 to the die-attach temperature. In some examples, flange 302 may be pre-stressed at the die-attach temperature just before attaching die 306 to flange 302 at the die-attach temperature. After the attachment of die 306 to flange 302, the temperature of device 300 may decline to a lower temperature, such as room temperature. The external stress on flange 306 may be gradually reduced as the temperature of device 300 declines, or the external stress on flange 306 may be released abruptly at a temperature between the die-attach temperature and the final resting temperature (e.g., room temperature).

In some examples, an external object such as a jig or fixture may apply the external stress to restrict flange 302 from expanding beyond certain dimensions. The external force may gradually decline to zero as flange 302 contracts to a size that is smaller than the dimensions of the jig or fixture. When the size of flange 302 is less than the dimensions of the jig or fixture, the jig or fixture may not exert any force on flange 302.

FIG. 4 shows a graph of force and temperature for a die-attach process that includes pre-stressing, in accordance with some examples of this disclosure. The graph in FIG. 4 may show the force or stress in each component after the die-attach step of the manufacturing process. By pre-stressing the flange, there may be tensile forces in the flange and compressive forces in the die at higher temperatures.

The graph of FIG. 4 may include a zero-stress point at approximately one hundred and fifty degrees Celsius or any other suitable temperature. In some examples, the zero-stress temperature may be higher or lower depending on the amount that the flange is pre-stressed. The temperature of the zero-stress point in FIG. 4 may be lower than the temperature of the zero-stress point in FIG. 2, which may result in a lower maximum stress at lower temperatures. This difference in maximum stress could be an enabling factor for die-attachment with high CTE mismatches, such as silicon or silicon carbide mounted on cheap copper flanges. In addition, these methods may allow better engineering of the stress behavior versus temperature. These methods may increase reliability and/or device performance due to reduced stress at the range of operating temperatures.

Figure 5:
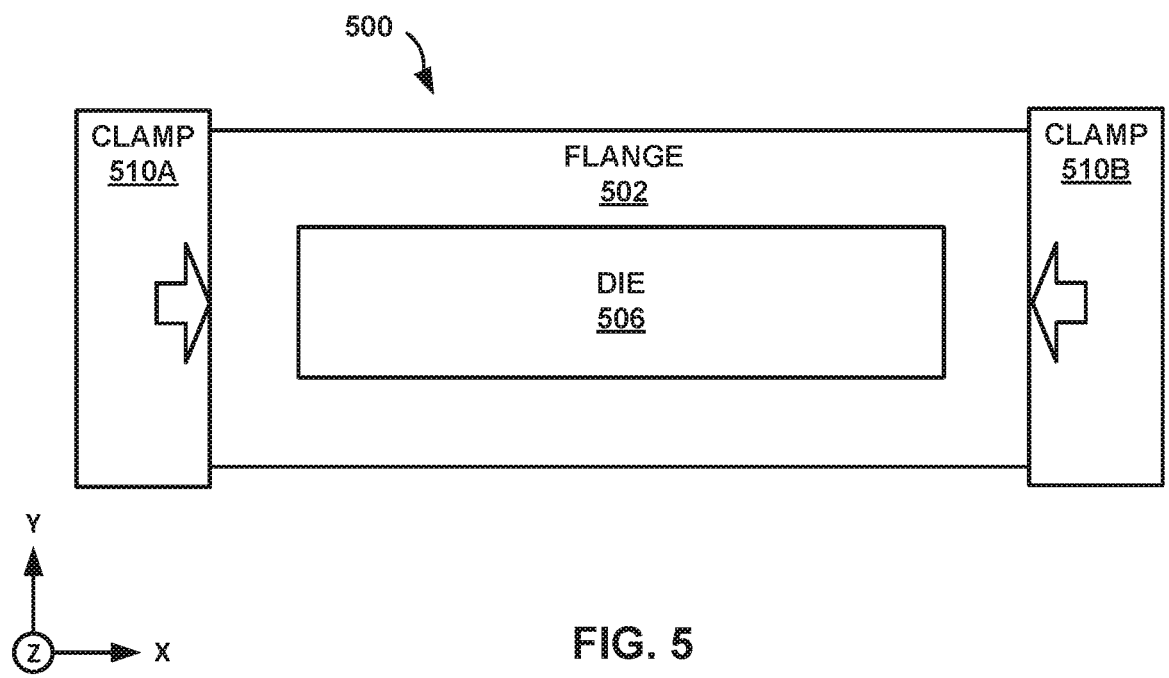
FIGS. 5 and 6 are conceptual block diagrams of possible methods for applying stress during a die-attach process, in accordance with some examples of this disclosure.
Figure 6:
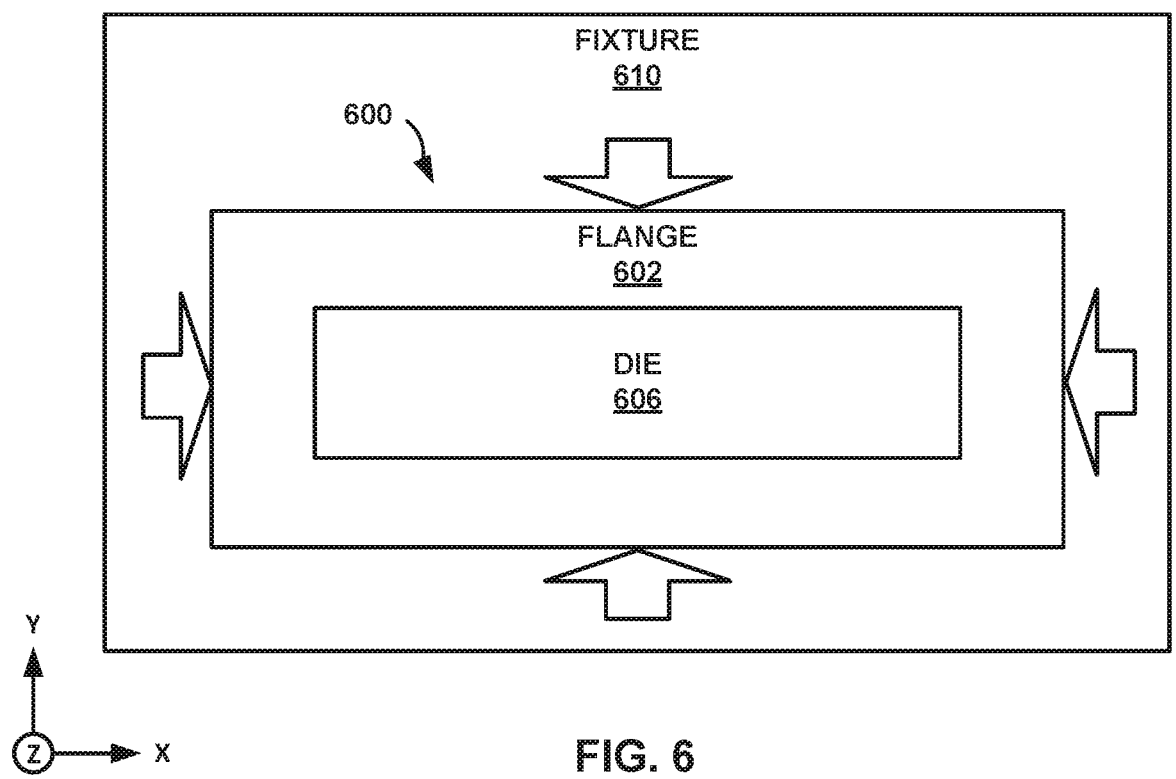

FIGS. 5 and 6 are conceptual block diagrams of possible methods for applying stress during a die-attach process, in accordance with some examples of this disclosure. The mechanical stress during the die-attach process can be applied by increasing the force on existing clamping fixtures as depicted in FIG. 5. Another possibility is shown in FIG. 6, which depicts the use of a fixture surrounding the flange. When applied to flanges 502 and 602, clamps 510A and 510B and fixture 610 may leave marks on or deform flanges 502 and 602. At the end of the manufacturing process for devices 500 and 600, there may be marks or imprints on flanges 502 and 602. The stress pattern caused by clamps 510A and 510B and/or fixture 610 may be complex, such that the marks or imprints will differ based on the shape of clamps 510A and 510B and/or fixture 610, the amount of force applied, the heating process, the die-attach temperature, the die-attach material, and/or other parameters of the manufacturing process.

By using a lower CTE material for the fixture than for the flange, mechanical stress may be applied to the flange at the higher die-attach temperature. For example, clamps 510A and 510B and/or fixture 610 may include a lower CTE material such as tungsten, diamond, molybdenum, invar, and alloys thereof. The flange may be inserted in the fixture at a lower temperature. The temperature where the flange and the fixture have the same dimensions may be defined as the "zero stress temperature." The options depicted in FIGS. 5 and 6 are only two of the many possible options to apply stress during the die-attach process. Depending on the die-attach materials, as well as the point of application (die or flange), either a compression or tensile force may be used.

Clamps 510A and 510B may be applied to device 500 in the x-axis direction before, during, or after a heating process. Clamps 510A and 510B may hinder expansion of flange 502 in the x-axis direction, which may be a "first direction." In some examples, clamps 510A and 510B may be configured to hinder expansion of flange 502 in the y-axis direction, which may be referred to as a "first direction" if clamps 510A and 510B are applied accordingly. Fixture 610 may be applied to device 600 before, during, or after a heating process. Fixture 610 may surround or encompass device 600 in the x-axis and y-axis directions. Fixture 610 may hinder expansion of flange 602 in the x-axis direction and in the y-axis direction, which may be a "first direction" and a "second direction." In some examples, fixture 610 may also be configured to hinder expansion of flange 602 in the z-axis direction.

Figure 7:
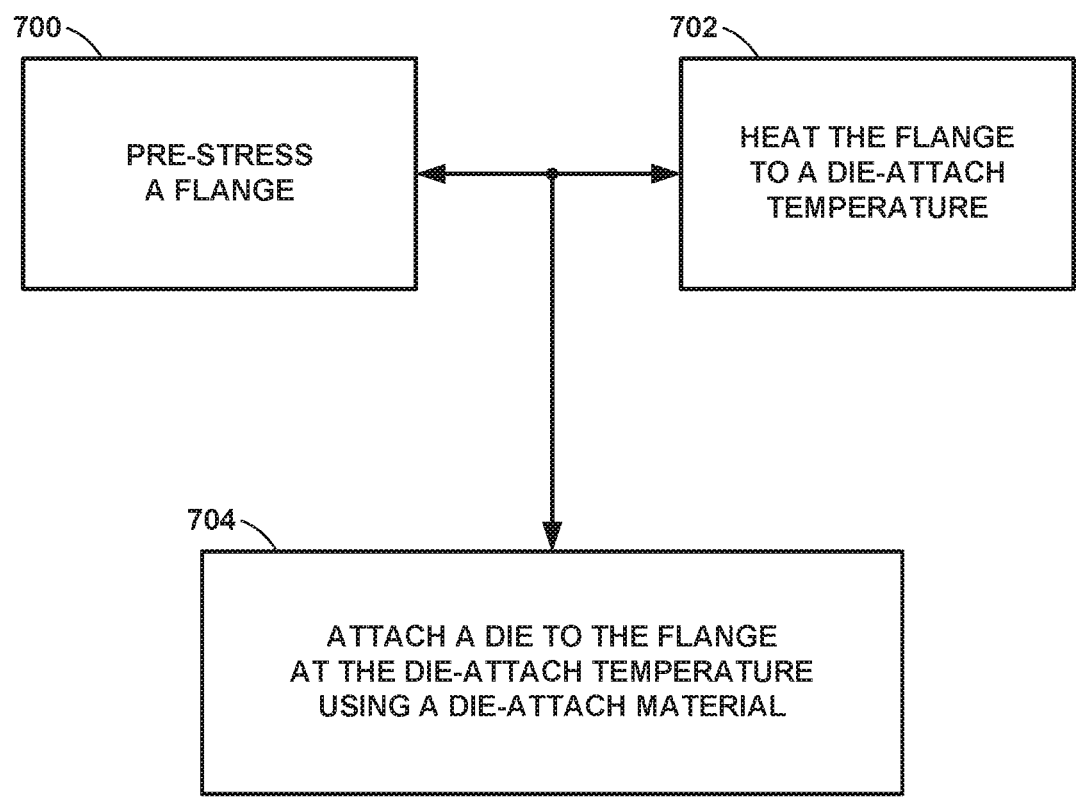
FIG. 7 is a flowchart illustrating example techniques for pre-stressing a device, in accordance with some examples of this disclosure.

FIG. 7 is a flowchart illustrating example techniques for pre-stressing a device, in accordance with some examples of this disclosure. The techniques of FIG. 7 are described with reference to device 100 in FIGS. 1A-1C, although other components, such as devices 300, 500, and 600, may exemplify similar techniques.

In the example of FIG. 7, the assembly process for device 100 may include pre-stressing flange 102 (700). Flange 102 may be pre-stressed before die 106 is attached to flange 102 using die-attach material 104. The pre-stressing may occur at room temperature before flange 102 is heated to a die-attach temperature. Additionally or alternatively, the pre-stressing may occur at the die-attach temperature or at a temperature between room temperature and the die-attach temperature. In some examples, the pre-stressing may occur gradually as flange 102 is heated to the die-attach temperature. In some examples, the assembly process may include a clamp and/or a fixture used to apply the stress to flange 102.

In the example of FIG. 7, the assembly process for device 100 may further include heating flange 102 to a die-attach temperature (702). Flange 102 may be heated before, during, or after flange 102 is pre-stressed in step 700. The die-attach temperature may be enough to cause die-attach material 104 to bind die 106 to flange 102. For example, solder may be heated to at least two hundred degrees Celsius to cause the solder to melt quickly, even though the melting temperature of solder is slightly below two hundred degrees Celsius. In some examples, the die-attach temperature may be less than two hundred degrees Celsius, such as when die-attach material 104 includes glue, adhesive, and/or paste. In some examples, glue, adhesive, and/or paste may have lower curing temperatures than the die-attach temperature for solder.

The pre-stressing of flange 102 does not necessarily need to occur before the heating process. However, it may be desirable to pre-stress flange 102 before attaching die 106 to flange 102. The pre-stressing and the heating may be performed in any order or any combination, including simultaneous pre-stressing and heating. Thus, flange 102 may be pre-stressed while being heated to the die-attach temperature, and flange 102 may be heated to the die-attach temperature while being pre-stressed. The heating process may have an equal or longer time duration than the pre-stressing process, or the pre-stressing process may have an equal or longer time duration than the heating process.

In the example of FIG. 7, the assembly process for device 100 may also include attaching die 106 to flange 102 at the die-attach temperature using die-attach material 104 (704). Die-attach material 104 may include solder, glue, tape, and/or paste that is applied to flange 102 and/or die 106 before step 704. After step 704, device 100 may be cooled, and flange 102 may thermally contract more quickly than die 106.

The pre-stressing of flange 102 may compensate for the compressive and tensile forces in device 100 at the ultimate temperature (e.g., an ambient temperature or a room temperature). FIG. 4 depicts possible compressive forces and tensile forces in device 100 as a result of pre-stressing flange 102. The pre-stressing may match flange 102 to die 106 during the die-attachment step, so that flange 102 and die 106 may contract in approximately equal amounts during a cooling step. For example, an assembly process may result in the forces depicted in FIG. 4 by heating flange 102 to approximately one hundred and fifty degrees and then pre-stressing flange 102 to its original dimensions. Flange 102 may also be pre-stressed at room temperature (e.g., twenty-five degrees Celsius) or at the die-attach temperature. In some examples, flange 102 may be externally pre-stressed simultaneously as flange 102 is heated.

The pre-stressing of device 100 may serve to improve the operation of device 100. For example, device 100 may be configured to operate at a temperature of twenty-five degrees Celsius in some examples (e.g., the intended operating temperature). Device 100 may also be configured to operate at a higher or lower ambient temperature, such as fifty degrees Celsius, one hundred degrees Celsius, minus fifty degrees Celsius, or minus one hundred degrees Celsius. The ambient temperature may vary based on the application and the manufacturing process.

The pre-stressing of device 100 may tune device 100 for operation at any temperature by achieving a zero-stress point at or near the intended operating temperature of device 100. A designer may choose the die-attach temperature and the amount of pre-stressing of device 100 based on the intended operating conditions of device 100. For example, if the intended operating temperature of device 100 is one hundred degrees Celsius, a designer may choose the amount of pre-stressing such that the zero-stress temperature is near the intended operating temperature. If the difference between the intended operating temperature and the die-attach temperature is relatively large, a designer may increase the amount of the pre-stressing of device 100. If the difference between the intended operating temperature and the die-attach temperature is relatively small, a designer may reduce the amount of the pre-stressing of device 100.

The manufacturing process may also include cooling device 100 to an ambient temperature. The designer may select the ambient temperature to be at or near the intended operating temperature of device 100. The designer may select the ambient temperature and the amount of pre-stress such that the zero-stress point of device 100 is at or near the intended operating temperature of device 100. The stresses at the zero-stress point may be balanced out such that flange 102 and die 106 have little or no compressive forces or tensile forces due to thermal expansion or thermal contraction.

The following numbered examples demonstrate one or more aspects of the disclosure.

EXAMPLE 1

A method includes pre-stressing a flange, heating the flange to a die-attach temperature, and attaching a die to the flange at the die-attach temperature using a die-attach material.

EXAMPLE 2

The method of example 1, wherein pre-stressing the flange includes clamping the flange in a first direction.

EXAMPLE 3

The method of example 2, wherein clamping the flange includes hindering expansion of the flange in the first direction.

EXAMPLE 4

The method of examples 1-3 or any combination thereof, wherein pre-stressing the flange includes positioning the flange in a fixture.

EXAMPLE 5

The method of example 4, wherein positioning the flange in the fixture includes positioning the flange in a fixture that hinders expansion of the flange in a first direction and in a second direction.

EXAMPLE 6

The method of examples 1-5 or any combination thereof, further including cooling the die and flange to a room temperature after attaching the die to the flange at the die-attach temperature using a die-attach material.

EXAMPLE 7

The method of examples 1-6 or any combination thereof, wherein pre-stressing the flange includes pre-stressing a copper flange, and wherein attaching the die includes attaching a semiconductor die to the flange at the die-attach temperature using the die-attach material.

EXAMPLE 8

The method of examples 1-7 or any combination thereof, wherein heating the flange to the die-attach temperature includes heating the flange to at least two hundred degrees Celsius, and wherein attaching the die to the flange at the die-attach temperature using the die-attach material includes attaching the die to the flange at least two hundred degrees Celsius using the die-attach material.

EXAMPLE 9

The method of examples 1-8 or any combination thereof wherein attaching the die to the flange at the die-attach temperature using the die-attach material includes attaching the die to the flange at the die-attach temperature using solder or an adhesive.

EXAMPLE 10

The method of examples 1-9 or any combination thereof, wherein pre-stressing the flange includes pre-stressing the flange while heating the flange to the die-attach temperature, and wherein heating the flange to the die-attach temperature while pre-stressing the flange includes pre-stressing the flange.

EXAMPLE 11

The method of examples 1-10 or any combination thereof, wherein heating the flange includes heating the flange to a die-attach temperature after pre-stressing the flange.

EXAMPLE 12

The method of examples 1-11 or any combination thereof, wherein heating the flange includes heating the flange to a die-attach temperature before pre-stressing the flange.

EXAMPLE 13

The method of examples 1-12 or any combination thereof, wherein pre-stressing the flange includes pre-stressing the flange while heating the flange to a die-attach temperature.

EXAMPLE 14

A device including a die, die-attach material, and a flange, wherein the device is prepared by a process including the steps of pre-stressing a flange, heating the flange to a die-attach temperature, and attaching a die to the flange at the die-attach temperature using a die-attach material.

EXAMPLE 15

The method of example 14, wherein pre-stressing the flange includes clamping the flange in a first direction.

EXAMPLE 16

The method of examples 14-15 or any combination thereof, wherein pre-stressing the flange includes positioning the flange in a fixture.

EXAMPLE 17

The method of examples 14-16 or any combination thereof, further including cooling the die and flange to a room temperature after attaching the die to the flange at the die-attach temperature using a die-attach material.

EXAMPLE 18

The method of examples 14-17 or any combination thereof, wherein pre-stressing the flange includes pre-stressing a copper flange, and wherein attaching the die includes attaching a semiconductor die to the flange at the die-attach temperature using the die-attach material.

EXAMPLE 19

The method of examples 14-18 or any combination thereof, wherein pre-stressing the flange includes pre-stressing the flange while heating the flange to the die-attach temperature, and wherein heating the flange to the die-attach temperature while pre-stressing the flange includes pre-stressing the flange.

EXAMPLE 20

The method of examples 14-19 or any combination thereof, wherein heating the flange to the die-attach temperature includes heating the flange to at least three hundred degrees Celsius, and wherein attaching the die to the flange at the die-attach temperature using the die-attach material includes attaching the die to the flange at least three hundred degrees Celsius using the die-attach material.

EXAMPLE 21

The method of examples 14-20 or any combination thereof, wherein attaching the die to the flange at the die-attach temperature using the die-attach material includes attaching the die to the flange at the die-attach temperature using solder or adhesive.

EXAMPLE 22

A method includes pre-stressing a metal flange, heating the metal flange to a die-attach temperature of at least two hundred degrees Celsius, attaching a semiconductor die to the metal flange at the die-attach temperature using solder or an adhesive, and cooling the semiconductor die and metal flange to a room temperature after attaching the semiconductor die to the metal flange at the die-attach temperature using a die-attach material.

EXAMPLE 23

The device of example 22, wherein pre-stressing the metal flange includes clamping the metal flange in a first direction to hinder expansion of the metal flange in the first direction.

EXAMPLE 24

The device of examples 22-23 or any combination thereof, wherein pre-stressing the metal flange includes positioning the metal flange in a fixture.

EXAMPLE 25

The device of example 24, wherein positioning the metal flange in the fixture includes positioning the metal flange in a fixture that hinders expansion of the metal flange in at least four directions.

EXAMPLE 26

The method of examples 1-13 or any combination thereof, further comprising cooling the flange to an ambient temperature, wherein pre-stressing the flange includes pre-stressing the flange such that the zero-stress temperature is within twenty degrees Celsius of the ambient temperature.

EXAMPLE 27

The method of example 26, wherein the ambient temperature is higher than fifty degrees Celsius.

EXAMPLE 28

The method of example 26, wherein the ambient temperature is higher than one hundred degrees Celsius.

EXAMPLE 29

The method of example 26, wherein the ambient temperature is less than zero degrees Celsius.

EXAMPLE 30

The method of examples 1-13 and 26-29 or any combination thereof, wherein the die-attach temperature is between one hundred and fifty degrees Celsius and three hundred degrees Celsius.

EXAMPLE 31

The method of examples 1-13 and 26-29 or any combination thereof, wherein the die-attach temperature is between two hundred degrees Celsius and three hundred degrees Celsius.

EXAMPLE 32

The method of examples 1-13 and 26-29 or any combination thereof, wherein the die-attach temperature is between two hundred degrees Celsius and four hundred degrees Celsius.

EXAMPLE 33

The method of examples 1-13 and 26-29 or any combination thereof, wherein the die-attach temperature is between one hundred degrees Celsius and two hundred degrees Celsius.

Various examples of the disclosure have been described. Any combination of the described systems, operations, or functions is contemplated. These and other examples are within the scope of the following claims.

What is claimed is:

1. A method comprising:
pre-stressing a flange that is not attached to any die;
heating the flange to a die-attach temperature; and
attaching a die to the pre-stressed flange at the die-attach temperature using a die-attach material, wherein the pre-stressing of the flange is maintained during attaching the die to the pre-stressed flange.

2. The method of claim 1, wherein pre-stressing the flange comprises clamping the flange in a first direction.

3. The method of claim 2, wherein clamping the flange comprises hindering expansion of the flange in the first direction.

4. The method of claim 1, wherein pre-stressing the flange comprises positioning the flange in a fixture.

5. The method of claim 4, wherein positioning the flange in the fixture comprises positioning the flange in a fixture that hinders expansion of the flange in a first direction and in a second direction.

6. The method of claim 1, further comprising cooling the die and pre-stressed flange to a room temperature after attaching the die to the pre-stressed flange at the die-attach temperature using a die-attach material.

7. The method of claim 1,
wherein pre-stressing the flange comprises pre-stressing a copper flange; and
wherein attaching the die comprises attaching a semiconductor die to the pre-stressed flange at the die-attach temperature using the die-attach material.

8. The method of claim 1,
wherein heating the flange to the die-attach temperature comprises heating the flange to at least two hundred degrees Celsius; and
wherein attaching the die to the pre-stressed flange at the die-attach temperature using the die-attach material comprises attaching the die to the pre-stressed flange at least two hundred degrees Celsius using the die-attach material.

9. The method of claim 1, wherein attaching the die to the pre-stressed flange at the die-attach temperature using the die-attach material comprises attaching the die to the pre-stressed flange at the die-attach temperature using solder or an adhesive.

10. The method of claim 1,
wherein pre-stressing the flange comprises pre-stressing the flange while heating the flange to the die-attach temperature, and
wherein heating the flange to the die-attach temperature while pre-stressing the flange comprises pre-stressing the flange.

11. The method of claim 1, wherein the pre-stressing is maintained during attaching the die to the pre-stressed flange to compensate for stress between the die and the flange during attaching the die to the pre-stressed flange.

12. The method of claim 1, wherein the die comprises gallium nitride material.

13. The method of claim 1, wherein the die comprises silicon carbide material.

14. A device comprising a die, die-attach material, and a flange, wherein the device is prepared by a process comprising the steps of:
pre-stressing the flange that is not attached to any die;
heating the flange to a die-attach temperature; and
attaching the die to the pre-stressed flange at the die-attach temperature using the die- attach material, wherein the pre-stressing is maintained during attaching the die to the pre- stressed flange.

15. The device of claim 14, wherein pre-stressing the flange comprises positioning the flange in a fixture.

16. The device of claim 14,
wherein pre-stressing the flange comprises pre-stressing a copper flange; and
wherein attaching the die comprises attaching a semiconductor die to the pre-stressed flange at the die-attach temperature using the die-attach material.

17. The device of claim 14,
wherein pre-stressing the flange comprises pre-stressing the flange while heating the flange to the die-attach temperature, and
wherein heating the flange to the die-attach temperature while pre-stressing the flange comprises pre-stressing the flange.

18. A method comprising:
pre-stressing a metal flange that is not attached to any semiconductor die;
heating the metal flange to a die-attach temperature of at least two hundred degrees Celsius;
attaching a semiconductor die to the pre-stressed metal flange at the die-attach temperature using solder or an adhesive, wherein the pre-stressing of the metal flange is maintained during attaching the semiconductor die to the pre-stressed metal flange; and
cooling the semiconductor die and pre-stressed metal flange to a room temperature after attaching the semiconductor die to the pre-stressed metal flange at the die-attach temperature using the solder or adhesive.

19. The method of claim 18, wherein pre-stressing the metal flange comprises clamping the metal flange in a first direction to hinder expansion of the metal flange in the first direction.

20. The method of claim 18, wherein pre-stressing the metal flange comprises positioning the metal flange in a fixture.

\* \* \* \* \*